United States Patent [19]

Chapman et al.

[11] Patent Number: 5,748,209
[45] Date of Patent: May 5, 1998

[54] THERMAL INK JET TAB CIRCUIT HAVING A PLURALITY OF TRACE GROUPS WHEREIN ADJACENT TRACES IN EACH GROUP ARE STAGGERED

[75] Inventors: Terri I. Chapman, Escondido; Hai Q. Tran, San Diego; Brian J. Keefe, La Jolla, all of Calif.

[73] Assignee: Hewlett-Packard Company, Palo Alto, Calif.

[21] Appl. No.: 331,784

[22] Filed: Oct. 31, 1994

[51] Int. Cl.$^6$ ........................................ B41J 2/01
[52] U.S. Cl. .................... 347/50; 361/749; 439/67
[58] Field of Search ........................ 347/50, 87; 174/254, 174/261; 257/786, 735; 361/777, 749; 439/67, 77

[56] References Cited

U.S. PATENT DOCUMENTS

| | | | |
|---|---|---|---|
| 4,794,409 | 12/1988 | Cowger et al. | 347/87 |
| 5,372,512 | 12/1994 | Wilson et al. | 439/67 |
| 5,610,642 | 3/1997 | Nobel et al. | 347/50 |

FOREIGN PATENT DOCUMENTS 0493092  3/1992  Japan ........................ 361/749

*Primary Examiner*—Benjamin R. Fuller
*Assistant Examiner*—L. Anderson

[57] ABSTRACT

A TAB circuit particularly suited for an ink jet pen and method of manufacture. A TAB circuit is presented which incorporates a central isolation area within the TAB circuit and an ESD protective ring which surrounds the TAB circuit. To facilitate plating, all of the active TAB traces are shorted together by individual plating interconnects located generally within the central isolation area. These interconnects are arranged in a staggered pattern such that sufficient clearance is available to punch out the interconnects without damaging an adjacent trace. The central isolation area is positioned between the TAB circuit window and the terminal pads. When the TAB circuit is mounted on an ink jet pen, the central isolation area is in a "wrap area" of the pen so no additional TAB circuit area is required over what is needed to properly position the TAB circuit on the pen. In addition, since the isolation area is located above an area of the pen housing that is provided with an insulation layer, the risk of the punched traces shorting to the pen housing is eliminated.

4 Claims, 5 Drawing Sheets

THERMAL INK JET TAB CIRCUIT HAVING A PLURALITY OF TRACE GROUPS WHEREIN ADJACENT TRACES IN EACH GROUP ARE STAGGERED

FIELD OF THE INVENTION

This invention relates to TAB connectors for making electrical connections to electrical components, and more particularly, to a method for metal plating of TAB circuits and for post plating isolation of the TAB circuit traces.

BACKGROUND OF THE INVENTION

The rapid development of new and advanced microelectronic devices has created a corresponding need for improved circuit mounting structures. One type of circuit mounting structure currently in use is called a tape automated bonded circuit, commonly known as a "TAB" circuit.

TAB circuits are known in the art as illustrated by U.S. Pat. No. 4,989,317 and 4,944,850, which are owned by Hewlett-Packard Company and incorporated herein by reference. A TAB circuit is constructed using a thin film carrier tape which is typically stored on large reels. The tape has a variable width typically between 8 and 70 mm, and is approximately 5 mils thick. The length of each portion of tape used to form an individual circuit package is selectively variable, depending on the type of circuit to be made. The tape may be manufactured from a variety of different dielectric materials, including polyimide such as Kapton. Polyimide is preferred in that it has a high degree of mechanical strength, is capable of withstanding relatively high temperatures, and has a high coefficient of linear expansion similar to that of copper. It also has a relatively low coefficient of moisture absorption (about 3%) which is an important characteristic when used in association with a thermal ink jet print head.

There are numerous methods which may be used to construct TAB circuits. One method, referred to as the "three layer process", involves the use of a thin, conductive foil preferably manufactured of copper or copper alloy which is bonded to the tape using an adhesive known in the art. The foil is approximately 1.4 mils thick. In addition, in the prior art, an opening or window is physically formed through the center of each portion or "frame" of tape by chemical etching or other conventional means, including the use a punch and die assembly. The foil is then etched to produce a conductive printed circuit pattern having beam-type inner leads which extend into the window.

In an alternative construction method commonly known as the "two layer process", a base layer of metal, such as copper, is directly sputtered or otherwise deposited onto the tape. Next, the tape substrate is run through an electrodeposition bath of metal (e.g., copper) which deposits a very thin layer of metal onto the substrate surface and first metal layer. After window formation, as described above, the top layer of metal is covered with a thin layer of photoresist which is imaged and developed, leaving an exposed metal pattern. The patterned substrate is passed though an electrolytic bath where a further metal layer is plated onto the exposed metal pattern. Resist materials are applied and subsequently etched to produce the completed product. This technology is discussed in Dixon, T., "TAB Technology Tackles High Density Interconnections", *Electronic Packaging and Production*, pp. 34–39 (December, 1984).

As noted above, the metal used to create the circuit pattern normally involves copper or a copper alloy. These materials have a tendency to corrode which adversely affects the operational capabilities of the circuit. To prevent surface corrosion, and to provide a low ohmic connection, the circuit pattern is normally plated with a non-corrosive metal such as gold.

Preferably the non-corrosive metal is electro-plated onto the circuit pattern. Electro-plating is a conventional process, which is accomplished by immersion of the circuit into a bath of metal solution, followed by the application of a current to the circuit through the solution. As a result of the current flow, metal from the solution is plated onto the circuit. For this process to work, all of the TAB circuit traces must be shorted together to ensure complete plating. In prior art devices, a conductive area is provided within the window area (where the integrated circuit is to be attached) such that it touches all of the traces. Then either a separate plating trace to provided to the conductive area or one of the TAB traces is used to provide electrical continuity to the conductive area and therefore all the traces on the TAB frame.

Once the plating process is finished, all of the traces must be isolated from each other for the TAB circuit to perform properly. In prior art devices, a punch is used to punch out the conductive area (and underlying polyimide) thereby removing the electrical short between all of the TAB traces. After the punch step, an integrated circuit is attached to the traces in the window area.

The prior art method of manufacturing a TAB frame works well for thermal ink jet print heads utilizing a bottom ink feed system. In such systems, the top face of the integrated circuit used in the print head is open as the polyimide is removed by the punch step. However, in newer "edge feed" ink feed systems, the polyimide cannot be removed in bulk but must remain in place covering the top face of the integrated circuit. Instead, precision holes are drilled through the polyimide above the top face of the integrated circuit to allow the proper amount of ink to be expelled by operation of the resistors in the integrated circuit.

Therefore a simple punch step removing a conductive area in the TAB window cannot be utilized to manufacture an edge feed TAB frame. So some other method of shorting, and later isolating, the TAB traces must be found that is effective, inexpensive to implement, and does not cause assembly problems such as shorting traces to the underlying conductive ink jet pen body.

A additional problem is how to provide electrostatic discharge (ESD) protection for the integrated circuit used in the print head. The integrated circuit is susceptible to high voltage discharges which can destroy or degrade the performance of the ink jet pen. Since the ink jet pens are typically handled by a user during installation, and the user may not use proper ESD suppression techniques, some protection must be afforded the integrated circuit.

SUMMARY OF THE INVENTION

The present invention is a TAB circuit particularly suited for use in edge feed ink jet pens. The TAB circuit provides ESD protection for the attached integrated circuit and is manufactured in a way that permits the TAB traces to be plated and subsequently isolated.

The present invention is constructed as a generally rectangular TAB circuit having terminal pads on one end. Each terminal pad is connected to a trace which terminates in an individual lead. All of the leads extend inwardly into an open region or "window" located approximately at the opposite end of the TAB circuit from the terminal pads. The window is designed to receive an integrated circuit (IC) or other device which is electrically connected to the trace leads.

To electroplate the traces and leads prior to attachment of the electronic device, all of the traces must be shorted together. This is accomplished, according to this invention, by constructing all of the traces in a staggered pattern with each trace connected to the adjacent trace(s) by a plating interconnect. Such that for "N" active traces, there are N-1 plating interconnects. All of the plating interconnects are located approximately in the middle of the TAB circuit between the "window" and the terminal pads. In this way, all of the active traces are interconnected for plating.

Once the plating process is completed, the plating interconnects must be removed to isolate the active traces from each other. The plating interconnects are removed by the use of a punch or like apparatus to remove the plating interconnects and a small amount of the underlying substrate. Each plating interconnect can be punched out individually or a gang punch can be utilized to punch out all of the plating interconnects in one operation.

ESD protection is provided to the integrated circuit by constructing an isolation ring around the perimeter of the TAB circuit. This ring channels an electro-static charge away from the active traces and to an equipment ground to which the ink jet pen is connected.

The present invention is particularly advantageous as the trace isolation area is located in a "wrap region" where the TAB circuit is folded over an underlying ink jet pen. Therefore no additional circuit space is utilized over what is required to properly locate the terminal pads and the integrated circuit on the pen. Also the isolation area is located within the perimeter of the TAB circuit so no additional constraints are imposed on the perimeter design of the TAB circuit. An additional advantage of the invention is that the isolation area is located above an area of the ink jet pen which has an insulating layer applied to it. So the punched traces do not come in contact with the conductive pen body thereby minimizing the chances of electrical shorts.

BRIEF DESCRIPTION OF THE INVENTION

DETAILED DESCRIPTION OF THE INVENTION

Figure 1:
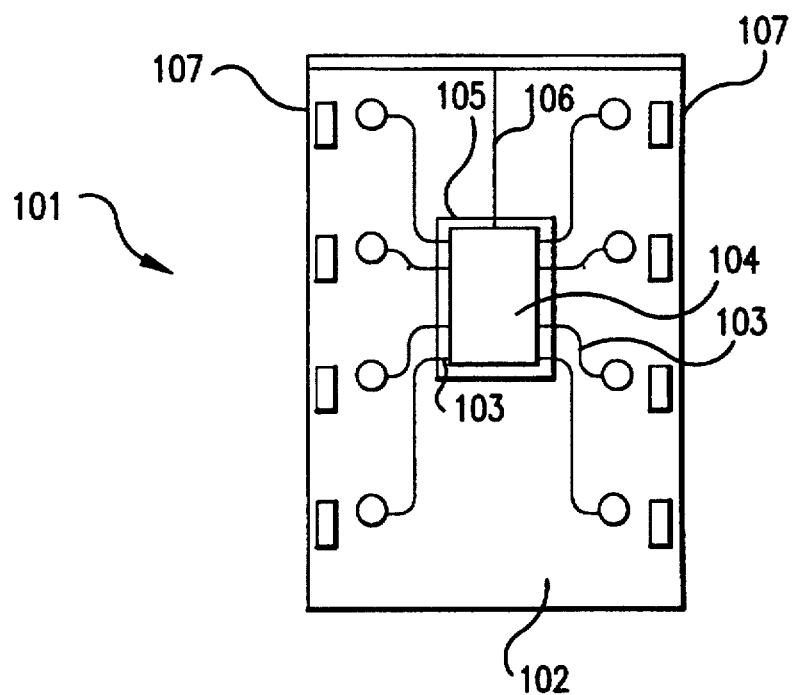
FIG. 1 illustrates a prior art TAB frame.

FIG. 1 illustrates a typical prior art ink jet TAB circuit. The TAB circuit 101 consists of a substrate 102 with traces 103 constructed on the substrate. All of the active traces 103 are connected to a central plating conductor 104 located in the window area 105 of the TAB circuit. A separate plating trace 106 is provided to connect the central plating conductor 104 to the periphery 107 of the TAB circuit.

Often the substrate is a polyimide material and the traces are copper or a copper alloy. The central plating conductor 104 is provided to short all of the active traces together so the traces can be plated. This central plating conductor is connected via trace 106 to the periphery where it is connected to a plating device.

Figure 2:
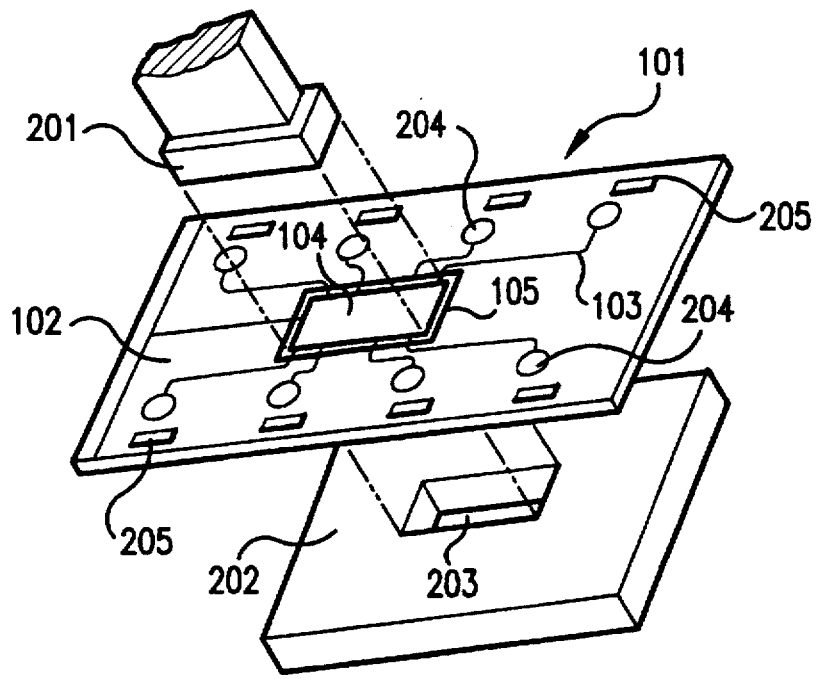
FIG. 2 illustrates a prior art trace isolation method.

After the plating operation, the traces must be isolated from each other. FIG. 2 illustrates a prior art isolation technique. To isolate the traces 103, a mechanical punch 201 and die 202 are utilized. The window area 105 of the TAB circuit is positioned over an aperture 203 in the die. Then the punch 201 is forced through the TAB frame and into the aperture. This process punches out the central plating conductor 104 and the underlying substrate thereby removing the short between the active traces.

Subsequent to the punch step, the sprocket holes 205 are sheared off and an integrated circuit (not shown) is mounted in the window area and connected to the traces 103. The traces 103 provide an electrical path from the terminal pads 204 to the integrated circuit as is known in the art.

As noted above, this method of manufacture will not produce a TAB circuit which can be used for edge feed ink jet systems. In an edge feed system, the physical integrity of the substrate above where the integrated circuit is mounted must be maintained. If the substrate is punched out above the integrated circuit, the ink jet head will not function properly. Also, the prior art TAB circuit does not provide for ESD protection which is more critical as the desired dot density of the pen increases. As the dot density increases, the size of the individual devices constructed on the integrated circuit decreases as does the tolerance of those devices to electrostatic discharges.

Figure 3:
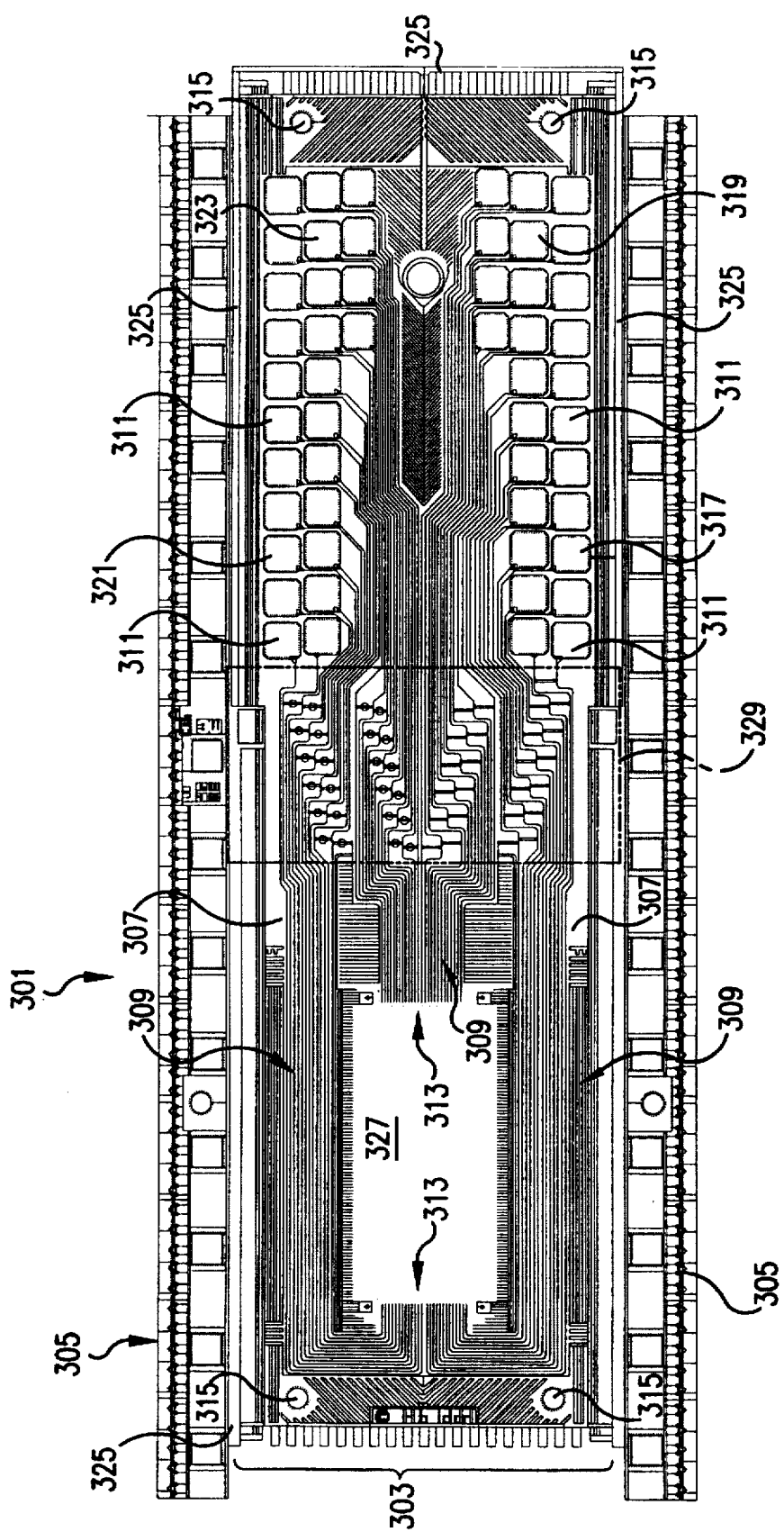
FIG. 3 illustrates a TAB frame according to the present invention.

FIG. 3 illustrates a TAB frame constructed according to a preferred embodiment of the present invention. The TAB frame 301 includes a central TAB circuit 303 and two peripheral sprocket drive strips 305 one on each side of the TAB circuit 303. The TAB circuit is constructed of a substrate 307, preferably of polyimide, with a plurality of traces 309 on one surface. At one end of each active trace is a terminal pad such as the pads indicated by 311 and at the other end is a terminal such as the terminals indicated by 313. Mounting features 315 are provided to mount the finished TAB circuit to an ink jet pen.

Four of the terminal pads 317, 319, 321 and 323 are ground terminal pads and are connected to a conductive area 325 on the periphery of the TAB circuit. The terminals 313 project into a "window" area 327 which is generally a bare area of substrate. Between the window area 327 and the terminal pads 311 is a central isolation area 329 through which all of the active traces pass.

Figure 4:
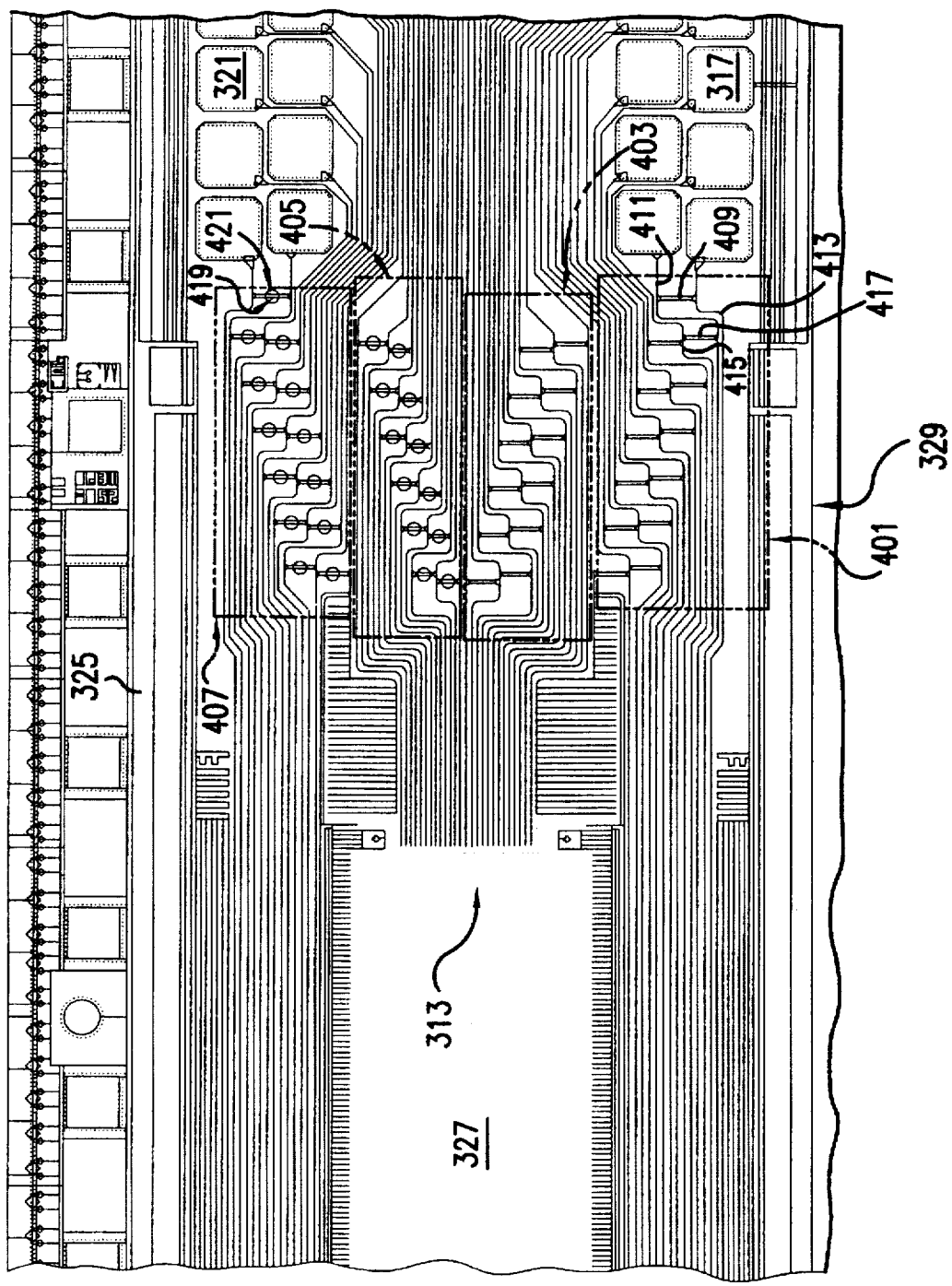
FIG. 4 is a detailed illustration of the central trace isolation area.

FIG. 4 illustrates the central isolation area 329 is greater detail. The TAB circuit traces are split into four groups 401, 403, 405 and 407. Each of the groups 401–407 is paired with a ground terminal pad. For example, trace group 401 is paired with ground terminal pad 317, trace group 403 is paired with ground terminal pad 319 (shown in FIG. 3). Within each trace group, the traces are constructed in a staggered pattern and connected to the immediately adjacent trace(s) with a plating interconnect of which 409 is, representative.

As an example, trace 411 is connected to traces 413 and 415 by the plating interconnects 409 and 417 respectively. In this manner, all the traces within a trace group are shorted together and tied to a ground terminal pad. As discussed above, all of the ground terminal pads 317–323 are connected to a conductive area 325 surrounding the TAB circuit 303.

Figure 5:
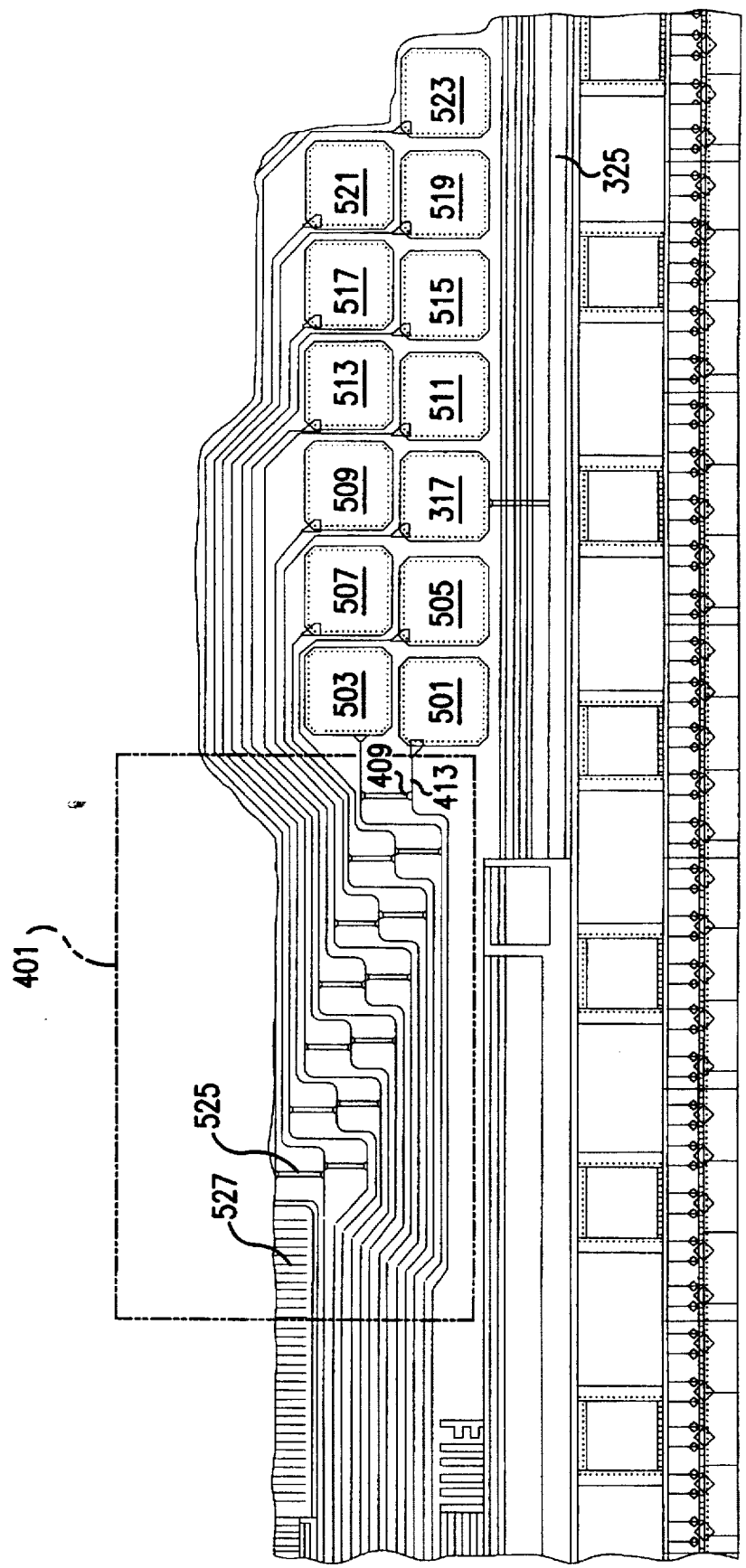
FIG. 5 is a detailed illustration of one trace group.

FIG. 5 illustrates the terminal pads and traces associated with trace group 401. As illustrated, the traces connected to terminal pads 501–523 and 317 are interconnected by plating interconnects such as 409. For N active traces, N–1 plating interconnects are used to short the traces together. An active trace is one that connects to the integrated circuit which is mounted on the TAB circuit. So twelve plating interconnects are used to interconnect the thirteen terminal pads associated with trace group 401. Plating interconnect 525 is used to connect area 527, unrelated to this invention, to the trace group. In this manner, all of the traces in trace group 401 are connected to the conductive area 325 through the ground terminal pad 317.

The other three trace groups 403, 405 and 407 are constructed in the same manner. That is, all of the traces in a trace group are shorted together by plating interconnects. Also, each trace group is connected to the conductive area 325 through a ground terminal pad.

The traces and patterns are formed on the substrate as is known in the art. Since all of the active traces are connected to the conductive area 325, the traces can be plated by connecting the conductive area 325 to a plating device. Once the plating step is finished, then the active traces must be isolated. That is, the plating interconnects must be removed.

As a result of the staggered layout of the traces within a trace group, the plating interconnects have a clearance area around them where traces are not routed. For example, plating interconnect 419 (FIG. 4) has a clearance represented by a circle 421. To isolate the traces shorted together by plating interconnect 419, the plating interconnect and the substrate below the circle 421 is punched out with a mechanical punch or the like. In like manner, all the other plating interconnects are punched out either separately or with a gang punch.

Once the punch isolation process in complete, the sprocket drive strips 305 are removed and an integrated circuit (not shown) is mounted in the window area of the TAB circuit and connected to the terminals 313.

The conductive area 325 is retained such that the TAB circuit is surrounded by a conductive ground. When the associated ink jet pen is mounted in a printer, the conductive area 325 is connected to the printer ground and provides a ground path for ESD charges. In this way ESD charges are channeled to the printer ground and not to the sensitive integrated circuit mounted on the TAB circuit.

Figure 6:
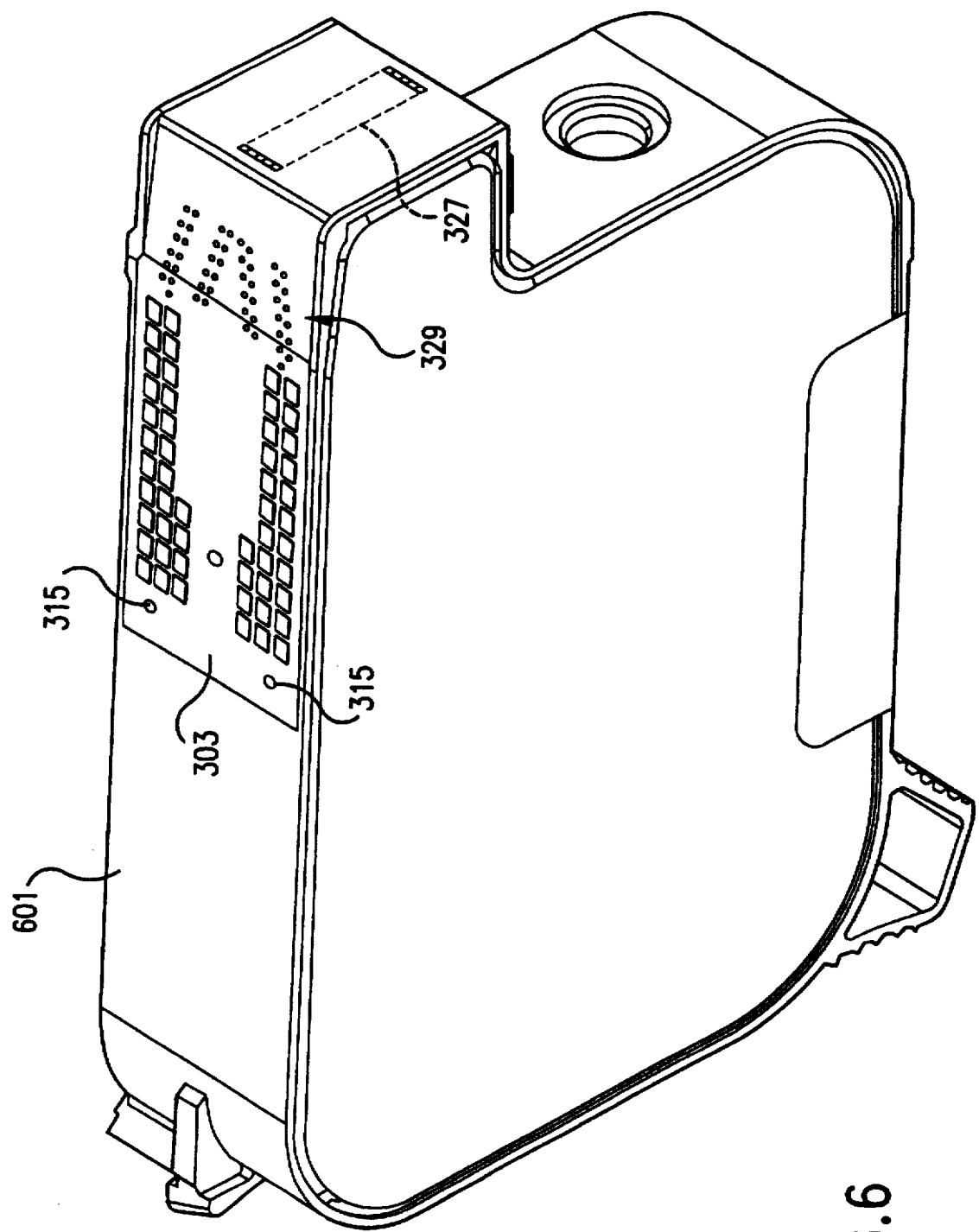
FIG. 6 illustrates a TAB circuit according to the present invention attached to an inkjet pen housing.

FIG. 6 illustrates the TAB circuit 303 mounted on an ink jet pen housing 601. The pen housing 601 is constructed of a carbon filled plastic and is therefore conductive. An insolation layer (not shown) is placed beneath the TAB circuit and serves to isolate the TAB traces from the pen housing. As such, the punched traces in the center isolation area 329 are prevented from shorting to the pen housing.

Also, since the isolation area 329 is inside the perimeter of the TAB circuit, no additional constraints are imposed on the perimeter design. Additionally, by being located in the wrap area of the ink jet pen, no additional TAB circuit space is used over what is needed to properly position the TAB circuit on the ink jet pen.

Other embodiments of the invention will be apparent to the skilled in the art from a consideration of this specification or practice of the invention disclosed herein. For example, while the traces are illustrated as being grouped into four trace groups, more traces can be shorted together to form fewer trace groups. Therefore it is intended that the specification and examples be considered as exemplary only, with the true scope and spirit of the invention being indicated by the following claims.

We claim:

1. An ink jet pen comprising:
   a pen body housing having an ink storage compartment therein and having outer surfaces which are contoured to mate with an ink jet printer;
   a flexible TAB circuit operationally secured to the pen body such that terminal pads on the TAB circuit mate with corresponding contacts on the ink jet printer;
   the TAB circuit having a plurality of active traces where the active traces are formed into trace groups and where the traces which form a trace group are arranged in a staggered pattern such that clearance areas are formed between adjacent traces;
   a plurality of interconnect conductors disposed between adjacent traces; and
   trace isolating openings disposed in said clearance areas for electrically separating interconnect conductors disposed between adjacent traces.

2. An ink jet pen as in claim 1 wherein the TAB circuit has a conductive area surrounding the active traces.

3. An ink jet per as in claim 2 wherein the conductive area is electrically connected to one terminal pad associated with each trace group.

4. A TAB circuit comprising:
   a flexible substrate;
   a plurality of active traces formed on said substrate and formed into respective trace groups wherein the traces which form a trace group are arranged in a staggered pattern such that clearance areas are formed between adjacent traces; and
   a plurality of shorting interconnect conductors disposed between adjacent active traces in said clearance areas such that the plurality of shorting interconnect conductors short all of the traces in a trace group.

* * * * *

UNITED STATES PATENT AND TRADEMARK OFFICE
CERTIFICATE OF CORRECTION

PATENT NO    :    5,748,209

DATED        :    May 5, 1998

INVENTOR(S)  :    Chapman et al.

It is certified that error appears in the above-identified patent and that said Letters Patent is hereby corrected as shown below:

At Column 2, line 17, delete "to" and insert in lieu thereof -is--.

At Column 4, line 46, delete "is" and insert in lieu thereof --in--.

At Column 6, line 35, delete "per" and insert in lieu thereof --pen--.

Signed and Sealed this

Third Day of November, 1998

*Attest:*

BRUCE LEHMAN

*Attesting Officer*   Commissioner of Patents and Trademarks